United States Patent
Lin

(10) Patent No.: US 7,960,749 B2
(45) Date of Patent: Jun. 14, 2011

(54) LIGHT-EMITTING DEVICE STRUCTURE AND SEMICONDUCTOR WAFER STRUCTURE WITH THE SAME

(75) Inventor: Shu Hui Lin, Taichung (TW)

(73) Assignee: Huga Optotech Inc., Taichung (TW)

( * ) Notice: Subject to any disclaimer, the term of this patent is extended or adjusted under 35 U.S.C. 154(b) by 26 days.

(21) Appl. No.: 12/421,923

(22) Filed: Apr. 10, 2009

(65) Prior Publication Data
US 2010/0123146 A1 May 20, 2010

(30) Foreign Application Priority Data
Nov. 19, 2008 (TW) ................ 97144631 A

(51) Int. Cl.
*H01L 33/00* (2010.01)
(52) U.S. Cl. .......... 257/98; 257/428; 257/431; 257/436; 257/79; 257/E33.067; 257/E33.068
(58) Field of Classification Search .............. 257/81, 257/88, 98, 436
See application file for complete search history.

(56) References Cited

U.S. PATENT DOCUMENTS

| | | | | |
|---|---|---|---|---|
| 5,753,940 A * | 5/1998 | Komoto | ........................... | 257/95 |
| 5,955,749 A * | 9/1999 | Joannopoulos et al. | ........ | 257/98 |
| 6,121,635 A * | 9/2000 | Watanabe et al. | ............... | 257/91 |
| 7,109,529 B2 * | 9/2006 | Uemura et al. | ................. | 257/99 |
| 7,638,811 B2 * | 12/2009 | Slater, Jr. | ....................... | 257/98 |
| 7,768,027 B2 * | 8/2010 | Tsai et al. | ........................ | 257/98 |
| 2005/0017250 A1 * | 1/2005 | Nitta et al. | ....................... | 257/79 |
| 2005/0072980 A1 * | 4/2005 | Ludowise et al. | ............... | 257/79 |
| 2005/0247949 A1 * | 11/2005 | Senda et al. | .................... | 257/98 |
| 2006/0065957 A1 * | 3/2006 | Hanya | ........................... | 257/676 |
| 2007/0023776 A1 * | 2/2007 | Zakgeym et al. | ............... | 257/99 |
| 2007/0170454 A1 * | 7/2007 | Andrews | ....................... | 257/100 |
| 2007/0189007 A1 * | 8/2007 | Nishimoto et al. | ........... | 362/227 |
| 2007/0228393 A1 * | 10/2007 | Yoneda | ........................... | 257/79 |
| 2007/0278512 A1 * | 12/2007 | Loh et al. | ........................ | 257/99 |
| 2008/0017872 A1 * | 1/2008 | Kim | ............................... | 257/89 |
| 2008/0042151 A1 * | 2/2008 | Oh et al. | ......................... | 257/88 |
| 2008/0179621 A1 * | 7/2008 | Oppermann et al. | ........... | 257/99 |
| 2009/0039371 A1 * | 2/2009 | Kim et al. | ....................... | 257/98 |
| 2009/0127578 A1 * | 5/2009 | Masuya | .......................... | 257/98 |
| 2009/0212311 A1 * | 8/2009 | Tsai et al. | ....................... | 257/98 |
| 2009/0212312 A1 * | 8/2009 | Tsai et al. | ....................... | 257/98 |
| 2010/0072500 A1 * | 3/2010 | Herrmann | ....................... | 257/98 |
| 2010/0163895 A1 * | 7/2010 | Horie | .............................. | 257/98 |
| 2010/0163910 A1 * | 7/2010 | Bougrov et al. | ................ | 257/98 |
| 2010/0181595 A1 * | 7/2010 | Oriji et al. | ..................... | 257/103 |

FOREIGN PATENT DOCUMENTS
TW 536841 6/2003
TW 561632 11/2003
* cited by examiner

*Primary Examiner* — Leonardo Andújar
*Assistant Examiner* — William Harriston
(74) *Attorney, Agent, or Firm* — WPAT, P.C.; Anthony King

(57) ABSTRACT

A light-emitting device structure comprises a substrate having a first region and a second region outside the first region, a first conductive type semiconductor layer positioned on the first region, a light-emitting structure positioned on the first conductive type semiconductor layer, a second conductive type semiconductor layer positioned on the light-emitting structure, and a wall structure positioned on the second region.

24 Claims, 6 Drawing Sheets

LIGHT-EMITTING DEVICE STRUCTURE AND SEMICONDUCTOR WAFER STRUCTURE WITH THE SAME

BACKGROUND OF THE INVENTION (A) Field of the Invention

The present invention relates to a light-emitting device structure and semiconductor wafer structure with the same, and more particularly, to a light-emitting device structure having a wall structure around the light-emitting device to increase the light-extraction efficiency and semiconductor wafer structure with the same.

(B) Description of the Related Art

Semiconductor light-emitting devices such as light-emitting diodes (LED) have been widely used in traffic lights, vehicle electronics, LCD backing lights, and general illumination. In the light-emitting diode an n-type semiconductor layer, a light-emitting region and a p-type semiconductor layer are essentially made to grow on a substrate to form a layered structure, and the electrodes are formed on the p-type semiconductor layer and on the n-type semiconductor layer. Light is generated through the recombination of holes and electrons that have been injected through the semiconductor layers to the light-emitting region, and then emitted through a light transmitting electrode on the p-type semiconductor layer or from the substrate. The material used for preparing the visible light-emitting diode includes the III-V compound such as AlGaInP for green, yellow, orange or red light-emitting diodes, and GaN for blue or ultraviolet light-emitting diodes, wherein the GaN light-emitting diode is formed on the sapphire substrate.

Extracting the light beams generated by the light-emitting layer to the outside of the light-emitting device is one important issue to be improved in the semiconductor light-emitting device. Researchers use the transparent electrode in the conventional light-emitting device to prevent the upward light beams generated by the light-emitting layer from being blocked on the propagation path to the outside of the light-emitting device, or use the reflection layer to reflect the downward light beams generated by the light-emitting layer back to the top of the light-emitting device. However, in addition to the upward light beams and downward light beams, the light-emitting layer also emits light beams in other directions, and a portion of the light beams are reflected internally into the light-emitting device due to the total reflection effect. Consequently, the light beams may be adsorbed by the light-emitting layer, rather than propagate to the outside of the light-emitting device.

TW 561632 discloses a semiconductor light-emitting device having at least one recess and/or protruding portion created for scattering or diffracting light generated in a light-emitting region on the surface portion of a substrate. The recess and/or protruding portion includes a shape that prevents crystal defects from occurring in semiconductor layers.

In addition, TW 536841 discloses a semiconductor light-emitting element having an undulation formed on the surface of a first layer (substrate), and a second layer having a refractive index different from that of the first layer grown to fill the undulation. Furthermore, a first crystal may be grown in an undulated shape on a crystal layer, which is the foundation of crystal growth. After such undulated refractive interface is formed, a semiconductor crystal layer having a refractive index different from that of the first layer is laminated thereon.

SUMMARY OF THE INVENTION

One aspect of the present invention provides a light-emitting device structure having a wall structure around the light-emitting device to increase the light-extraction efficiency and semiconductor wafer structure with the same.

A light-emitting device structure according to this aspect of the present invention comprises a substrate having a first region and a second region outside the first region, a first conductive type semiconductor layer positioned on the first region, a light-emitting structure positioned on the first conductive type semiconductor layer, a second conductive type semiconductor layer positioned on the light-emitting structure, and a wall structure positioned on the second region.

Another aspect of the present invention provides a semiconductor wafer structure comprising a substrate, a plurality of light-emitting devices positioned on the substrate, at least one scribe line separating the light-emitting devices, and a wall structure positioned on the scribe line. The light-emitting device includes a first conductive type semiconductor layer, a light-emitting structure positioned on the first conductive type semiconductor layer, and a second conductive type semiconductor layer positioned on the light-emitting structure.

The foregoing includes outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which:

FIG. 1 illustrates a semiconductor wafer structure according to one embodiment of the present invention;

FIG. 2 is a cross-sectional view along a cross-sectional line 1-1 of FIG. 1;

FIG. 3 illustrates a semiconductor wafer structure according to another embodiment of the present invention;

FIG. 4 is a cross-sectional view along a cross-sectional line 2-2 of FIG. 3;

FIG. 5 illustrates a semiconductor wafer structure according to another embodiment of the present invention; and FIG. 6 is a cross-sectional view along a cross-sectional line 3-3 of FIG. 5.

DETAILED DESCRIPTION OF THE INVENTION

FIG. 1 and FIG. 2 illustrate a semiconductor wafer structure 10A according to one embodiment of the present invention, wherein FIG. 2 is a cross-sectional view along a cross-sectional line 1-1 in FIG. 1. The semiconductor wafer structure 10A comprises a substrate 12A, a plurality of light-emitting devices 20A positioned on the substrate 12A, a plurality of scribe lines 40A separating the light-emitting devices 20A, and a plurality of wall structures 50A positioned on the scribe lines 40A. In one embodiment of the present invention, the substrate 12A includes a first region 14A and a second region 16A outside the first region 14A, the light-emitting device is positioned in the first region 14A, and the scribe line 40A is positioned in the second region 16A. For example, the second region 16A surrounds the first region 14A, i.e., the wall structure 50A surrounds the light-emitting device 10A. The sidewall surface of the wall structure 50A can be wavy or arc-shaped, and the lateral thickness of the wall structure 50A varies non-periodically.

Figure 1:
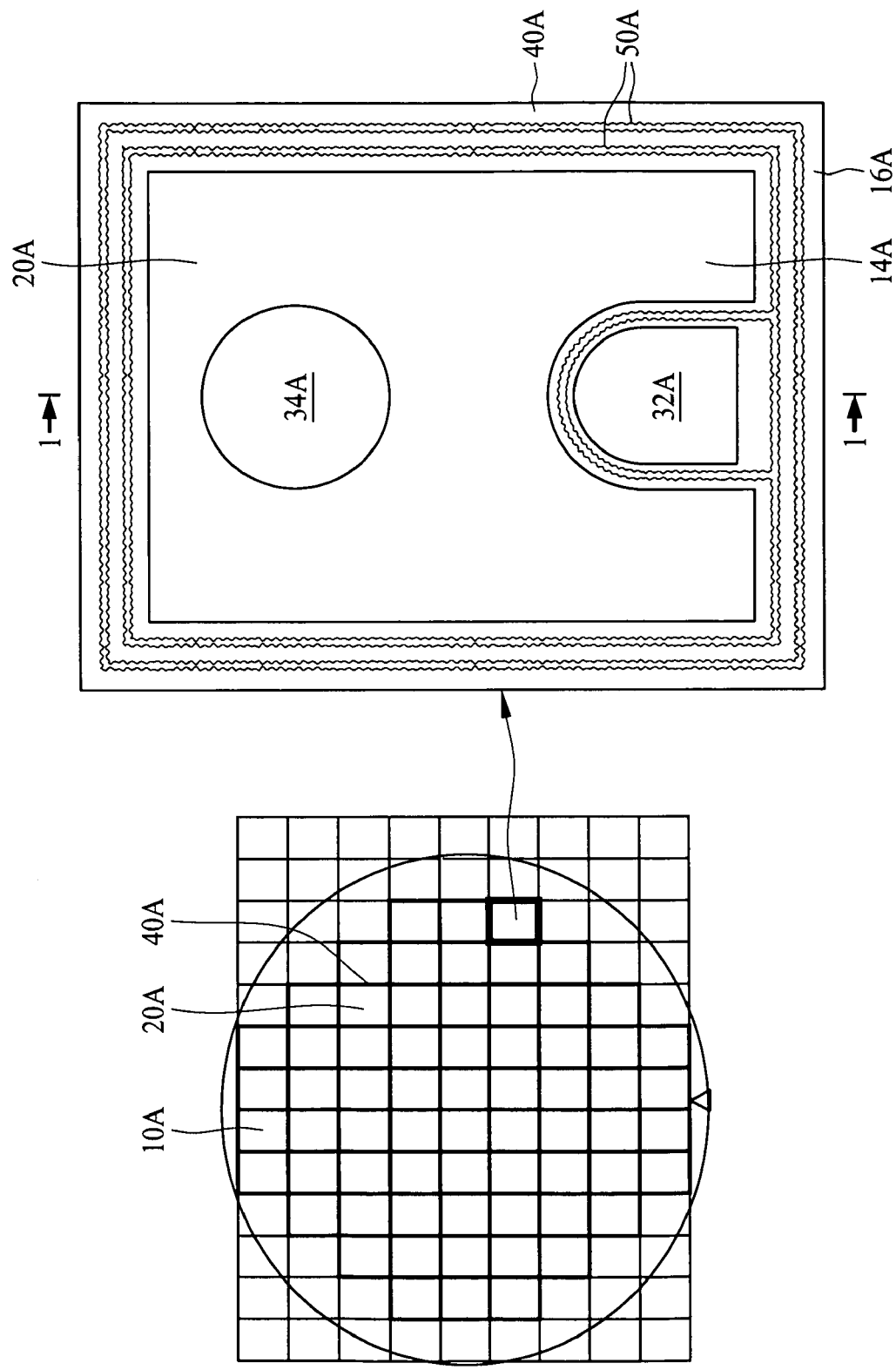
Figure 2:
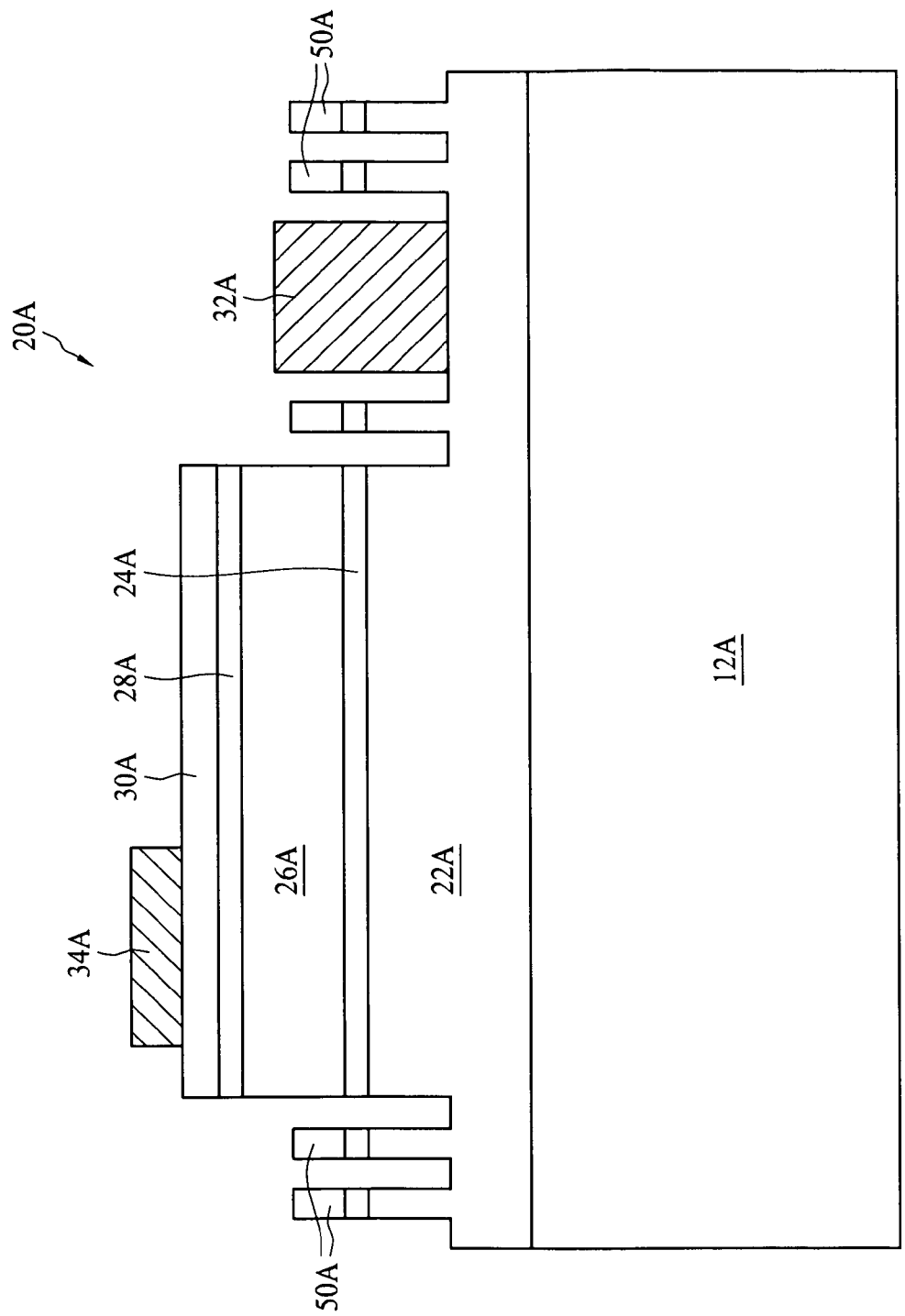

Referring to FIG. 2, the light-emitting device 10A includes an n-type semiconductor layer 22A, a light-emitting structure 24A positioned on the n-type semiconductor layer 22A, a p-type semiconductor layer 26A positioned on the light-emitting structure 24A, a contact layer 28A positioned on the p-type semiconductor layer 26A, a transparent conductive layer 30A positioned on the contact layer 28A, a first electrode 32A positioned on the n-type semiconductor layer 22A, and a second electrode 34A positioned on the transparent conductive layer 30A. In one embodiment of the present invention, the p-type semiconductor layer 26A includes a top end and a bottom end, and the wall structure 50A includes a top end between the top end and the bottom end of the p-type semiconductor layer 26A.

In the conventional light-emitting device, a portion of emitted light beams is reflected internally in the light-emitting device due to the total reflection effect, and consequently the reflected light beams are adsorbed by the light-emitting layer itself, rather than propagate to the outside of the light-emitting device. To solve this problem and to increase the light-extraction efficiency, one embodiment of the present invention introduces the wall structure 50A surrounding the light-emitting device 20A to change the incident angle of the light beams propagating from the light-emitting device (high reflection index material) 20A to the air (low reflection index material) so as to avoid the total reflection effect, i.e., preventing the light beams from being adsorbed by the light-emitting structure itself by avoiding the occurrence of the repeated total reflection in the light-emitting device 20A. Consequently, the light-extraction efficiency of the light-emitting device 20A can be increased dramatically.

The layers on the substrate 12A can be prepared by the epitaxy machine, the lithographic process can be used to pattern the shape (such as wavy or arc-shaped) of the wall structure 50A on the scribe line 40A, and the dry etching can be used to etch the layers down to a predetermined depth to prepare the wall structure 50A. In one embodiment of the present invention, the substrate 12A includes transparent insulation material such as sapphire; the n-type semiconductor layer 22A, the light-emitting structure 24A and the p-type semiconductor layer 26A include nitride material such as aluminum-gallium-nitride (AlGaN), gallium nitride (GaN), indium-gallium nitride (InGaN), or aluminum-gallium-indium nitride (AlGaInN); the contact layer 28A includes nitride material such as aluminum-gallium-nitride (AlGaN), gallium nitride (GaN), indium-gallium nitride (InGaN), or aluminum-gallium-indium nitride (AlGaInN); the transparent conductive layer 30A includes indium oxide, tin oxide or indium tin oxide; and the light-emitting structure 24A may use the quantum well or multi-quantum well structure.

Figure 3:
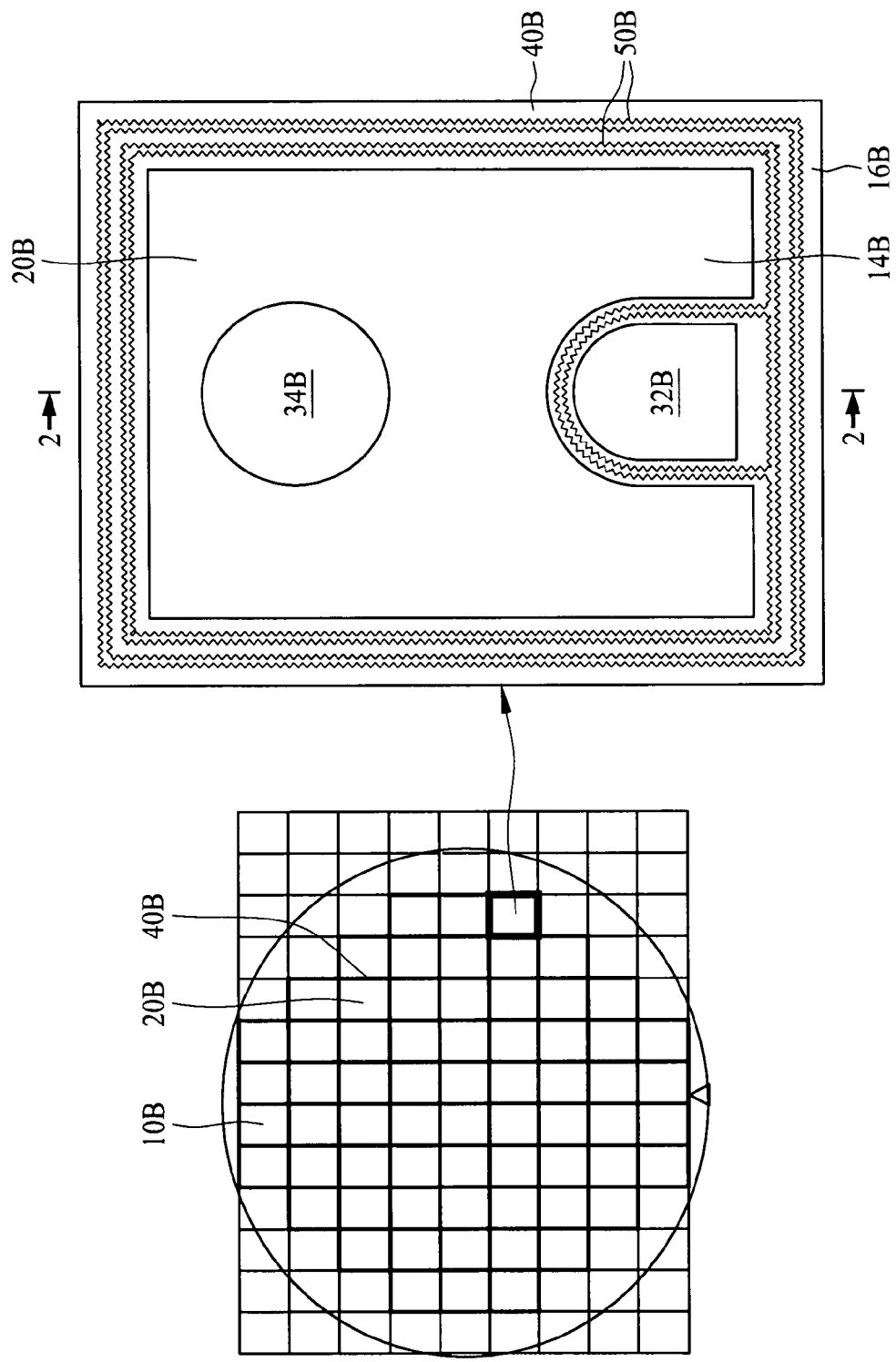
Figure 4:
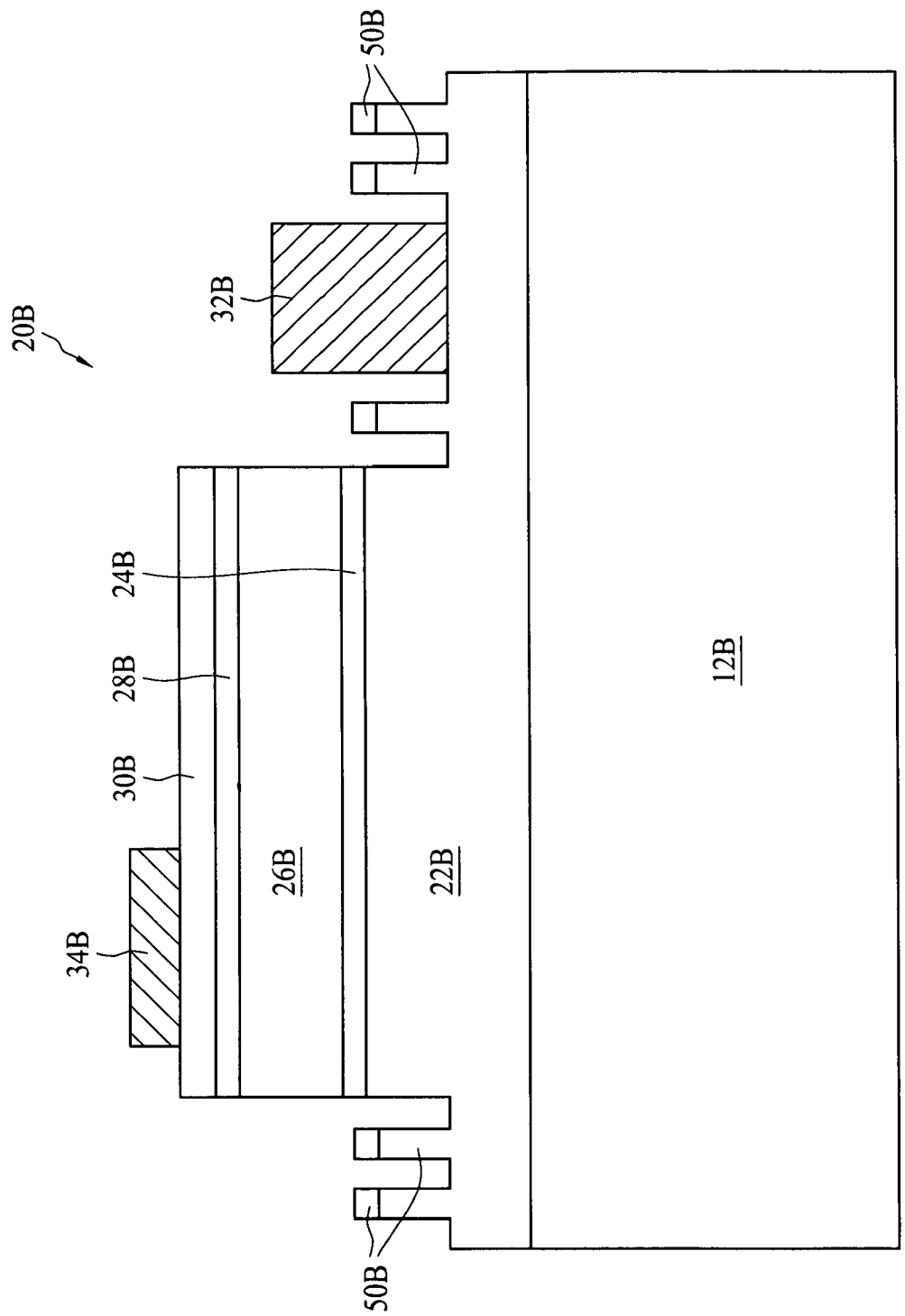

FIG. 3 and FIG. 4 illustrate a semiconductor wafer structure 10B according to another embodiment of the present invention, wherein FIG. 4 is a cross-sectional view along a cross-sectional line 2-2 in FIG. 3. The semiconductor wafer structure 10B comprises a substrate 12B, a plurality of light-emitting devices 20B positioned on the substrate 12B, a plurality of scribe lines 40B separating the light-emitting devices 20B, and a plurality of wall structures 50B positioned on the scribe lines 40B. In one embodiment of the present invention, the substrate 12B includes a first region 14B and a second region 16B outside the first region 14B, the light-emitting device is positioned in the first region 14B, and the scribe line 40B is positioned in the second region 16B. For example, the second region 16B surrounds the first region 14B, i.e., the wall structure 50B surrounds the light-emitting device 10B. The sidewall surface of the wall structure 50B can be scraggy or zigzag, and the lateral thickness of the wall structure 50B varies periodically.

Referring to FIG. 4, the light-emitting device 10B includes an n-type semiconductor layer 22B, a light-emitting structure 24B positioned on the n-type semiconductor layer 22B, a p-type semiconductor layer 26B positioned on the light-emitting structure 24B, a contact layer 28B positioned on the p-type semiconductor layer 26B, a transparent conductive layer 30B positioned on the contact layer 28B, a first electrode 32B positioned on the n-type semiconductor layer 22B, and a second electrode 34B positioned on the transparent conductive layer 30B. In one embodiment of the present invention, the light-emitting structure 24B includes a top end and a bottom end, and the wall structure 50B includes a top end between the top end and the bottom end of the light-emitting structure 24B.

In the conventional light-emitting device, a portion of emitted light beams is reflected internally in the light-emitting device due to the total reflection effect, and consequently the reflected light beams are adsorbed by the light-emitting layer itself, rather than propagate to the outside of the light-emitting device. To solve this problem and to increase the light-extraction efficiency, one embodiment of the present invention introduces the wall structure 50B surrounding the light-emitting device 20B to change the incident angle of the light beams propagating from the light-emitting device (high reflection index material) 20B to the air (low reflection index material) so as to avoid the total reflection effect, i.e., preventing the light beams from being adsorbed by the light-emitting layer itself by avoiding the occurrence of the repeated total reflection in the light-emitting device 20B. Consequently, the light-extraction efficiency of the light-emitting device 20B is increased.

The layers on the substrate 12B can be prepared by the epitaxy machine, the lithographic process can be used to pattern the shape (such as scraggy or zigzag) of the wall structure 50B on the scribe line 40B, and the dry etching can be used to etch the layers down to a predetermined depth to prepare the wall structure 50B. In one embodiment of the present invention, the substrate 12B includes transparent insulation material such as sapphire; the n-type semiconductor layer 22B, the light-emitting structure 24B and the p-type semiconductor layer 26B include nitride material such as aluminum-gallium-nitride (AlGaN), gallium nitride (GaN), indium-gallium nitride (InGaN), or aluminum-gallium-indium nitride (AlGaInN); the contact layer 28B includes nitride material such as aluminum-gallium-nitride (AlGaN), gallium nitride (GaN), indium-gallium nitride (InGaN), or aluminum-gallium-indium nitride (AlGaInN); the transparent conductive layer 30B includes indium oxide, tin oxide or indium tin oxide; and the light-emitting structure 24B may use the quantum well or multi-quantum well structure.

Figure 5:
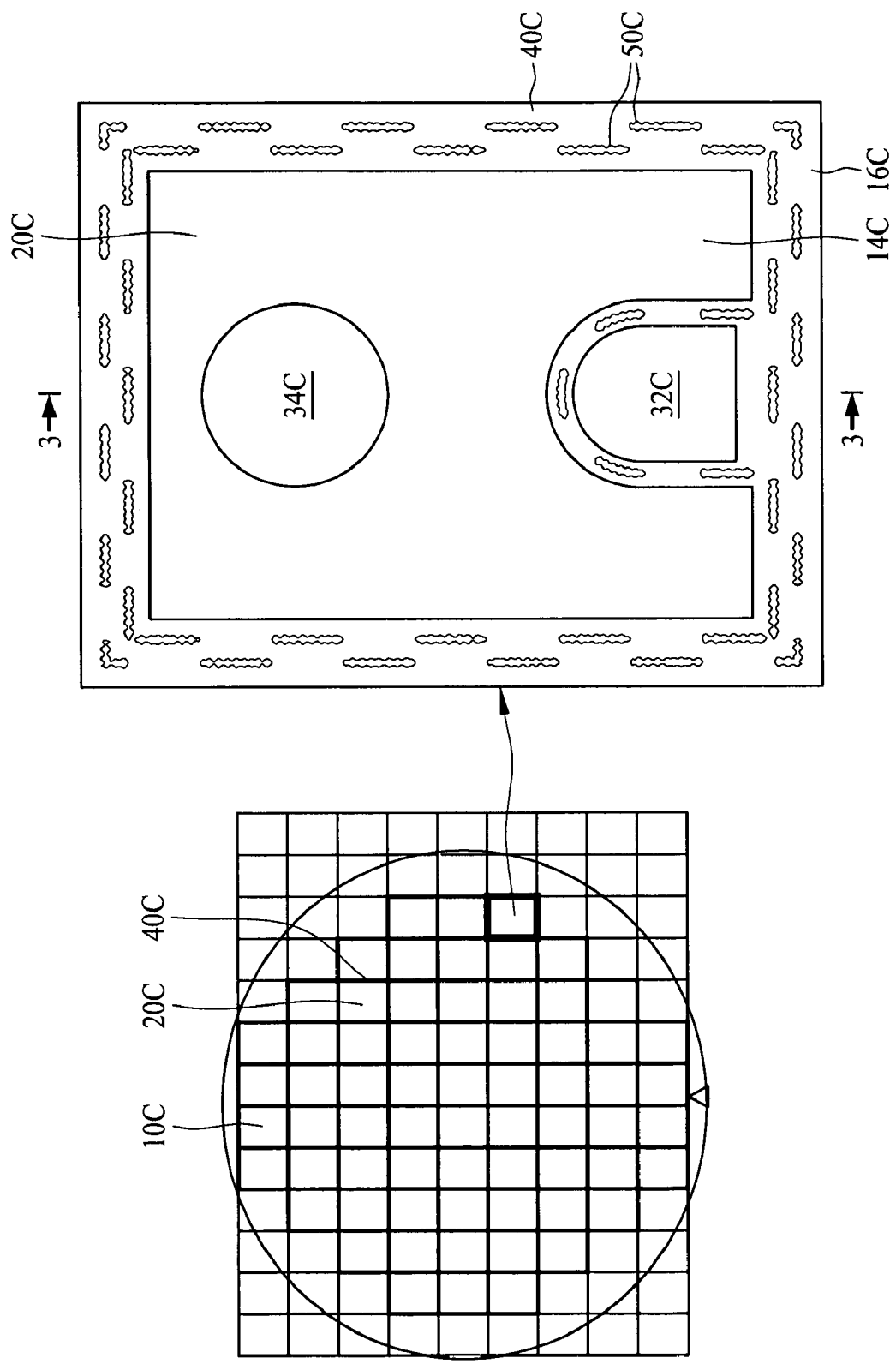
Figure 6:
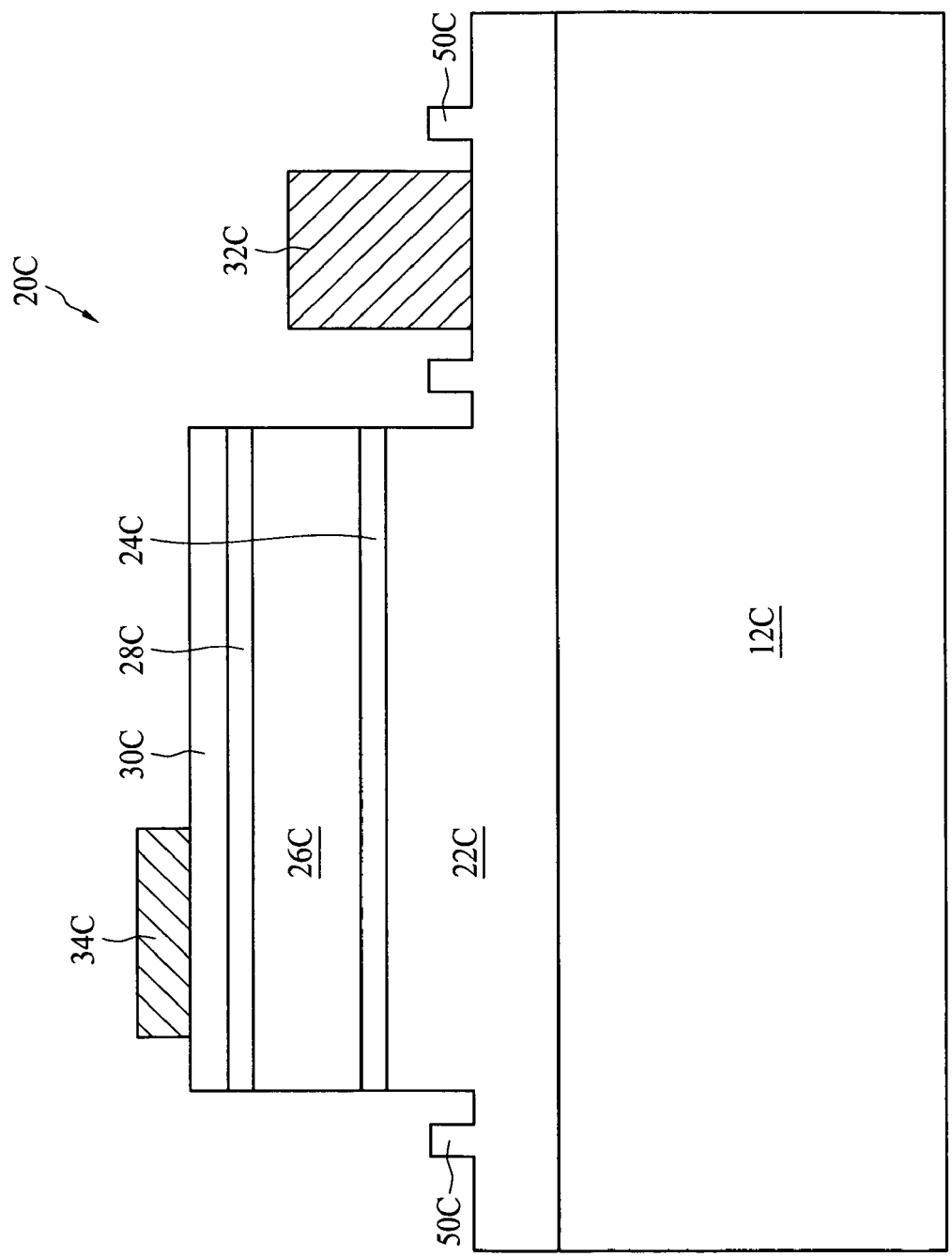

FIG. 5 and FIG. 6 illustrate a semiconductor wafer structure 10C according to another embodiment of the present invention, wherein FIG. 6 is a cross-sectional view along a cross-sectional line 3-3 in FIG. 5. The semiconductor wafer structure 10C comprises a substrate 12C, a plurality of light-emitting devices 20C positioned on the substrate 12C, a plurality of scribe lines 40C separating the light-emitting devices 20C, and a plurality of wall structures 50C positioned on the scribe lines 40C.

In one embodiment of the present invention, the substrate 12C includes a first region 14C and a second region 16C outside the first region 14C, the light-emitting device is positioned in the first region 14C, and the scribe line 40C is positioned in the second region 16C. For example, the second region 16C surrounds the first region 14C, i.e., the wall structure 50C surrounds the light-emitting device 10C. The wall structures 50C are arranged in a ring-shaped manner and separated from each other, and the sidewall surface of the wall structure 50C includes at least two concavities. In addition, the wall structures 50C in the inner ring and the outer ring are arranged in a staggered manner.

Referring to FIG. 6, the light-emitting device 10C includes an n-type semiconductor layer 22C, a light-emitting structure 24C positioned on the n-type semiconductor layer 22C, a p-type semiconductor layer 26C positioned on the light-emitting structure 24C, a contact layer 28C positioned on the p-type semiconductor layer 26C, a transparent conductive layer 30C positioned on the contact layer 28C, a first electrode 32C positioned on the n-type semiconductor layer 22C, and a second electrode 34C positioned on the transparent conductive layer 30C. In one embodiment of the present invention, the light-emitting structure 28C includes a top end and a bottom end, and the n-type semiconductor layer 22C includes a top end between the top end and the bottom end of the n-type semiconductor layer 22C.

In the conventional light-emitting device, a portion of emitted light beams is reflected internally in the light-emitting device due to the total reflection effect, and consequently the reflected light beams are adsorbed by the light-emitting layer itself, rather than propagate to the outside of the light-emitting device. To solve this problem and to increase the light-extraction efficiency, one embodiment of the present invention introduces the wall structure 50C surrounding the light-emitting device 20C to change the incident angle of the light beams propagating from the light-emitting device (high reflection index material) 20C to the air (low reflection index material) so as to avoid the total reflection effect, i.e., preventing the light beams from being adsorbed by the light-emitting layer itself by avoiding the occurrence of the repeated total reflection in the light-emitting device 20C. Consequently, the light-extraction efficiency of the light-emitting device 20C is increased.

The layers on the substrate 12C can be prepared by the epitaxy machine, the lithographic process can be used to pattern the shape of the wall structure 50C on the scribe line 40C, and the dry etching can be used to etch the layers down to a predetermined depth to prepare the wall structure 50C. In one embodiment of the present invention, the substrate 12C includes transparent insulation material such as sapphire; the n-type semiconductor layer 22C, the light-emitting structure 24C and the p-type semiconductor layer 26C include nitride material such as aluminum-gallium-nitride (AlGaN), gallium nitride (GaN), indium-gallium nitride (InGaN), or aluminum-gallium-indium nitride (AlGaInN); the contact layer 28C includes nitride material such as aluminum-gallium-nitride (AlGaN), gallium nitride (GaN), indium-gallium nitride (InGaN), or aluminum-gallium-indium nitride (AlGaInN); the transparent conductive layer 30C includes indium oxide, tin oxide or indium tin oxide; and the light-emitting structure 24C may use the quantum well or multi-quantum well structure.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light-emitting device structure, comprising:
   a substrate having a first region and a second region outside the first region;
   a first conductive type semiconductor layer positioned on the first region;
   a light-emitting structure positioned on the first conductive type semiconductor layer;
   a second conductive type semiconductor layer positioned on the light-emitting structure; and
   a wall structure positioned on the second region, wherein the first conductive type semiconductor layer includes a top end and a bottom end, and the wall structure includes a top end between the top end and the bottom end of the first conductive type semiconductor layer.

2. The light-emitting device structure of claim 1, wherein the wall structure surrounds the first region.

3. The light-emitting device structure of claim 1, wherein the wall structure includes a sidewall surface, which is wavy, arc-shaped, scraggy, or zigzag.

4. The light-emitting device structure of claim 1, wherein the lateral thickness of the wall structure varies periodically.

5. The light-emitting device structure of claim 1, wherein the lateral thickness of the wall structure varies non-periodically.

6. The light-emitting device structure of claim 1, wherein the wall structure includes at least two concavities.

7. The light-emitting device structure of claim 1, comprising a plurality of wall structures separated from each other.

8. The light-emitting device structure of claim 1, comprising a plurality of wall structures arranged in a staggered manner.

9. A light-emitting device structure, comprising:
   a substrate having a first region and a second region outside the first region;
   a first conductive type semiconductor layer positioned on the first region;
   a light-emitting structure positioned on the first conductive type semiconductor layer;
   a second conductive type semiconductor layer positioned on the light-emitting structure; and
   a wall structure positioned on the second region, wherein the light-emitting structure includes a top end and a bottom end, and the wall structure includes a top end between the top end and the bottom end of the light-emitting structure.

10. The light-emitting device structure of claim 9, wherein the wall structure surrounds the first region.

11. The light-emitting device structure of claim 9, wherein the wall structure includes a sidewall surface, which is wavy, arc-shaped, scraggy, or zigzag.

12. The light-emitting device structure of claim 9, wherein the lateral thickness of the wall structure varies periodically.

13. The light-emitting device structure of claim 9, wherein the lateral thickness of the wall structure varies non-periodically.

14. The light-emitting device structure of claim 9, wherein the wall structure includes at least two concavities.

15. The light-emitting device structure of claim 9, comprising a plurality of wall structures separated from each other.

16. The light-emitting device structure of claim 9, comprising a plurality of wall structures arranged in a staggered manner.

17. A light-emitting device structure, comprising:
- a substrate having a first region and a second region outside the first region;
- a first conductive type semiconductor layer positioned on the first region;
- a light-emitting structure positioned on the first conductive type semiconductor layer;
- a second conductive type semiconductor layer positioned on the light-emitting structure; and
- a wall structure positioned on the second region, wherein the second conductive type semiconductor layer includes a top end and a bottom end, and the wall structure includes a top end between the top end and the bottom end of the second conductive type semiconductor layer.

18. The light-emitting device structure of claim 17, wherein the wall structure surrounds the first region.

19. The light-emitting device structure of claim 17, wherein the wall structure includes a sidewall surface, which is wavy, arc-shaped, scraggy, or zigzag.

20. The light-emitting device structure of claim 17, wherein the lateral thickness of the wall structure varies periodically.

21. The light-emitting device structure of claim 17, wherein the lateral thickness of the wall structure varies non-periodically.

22. The light-emitting device structure of claim 17, wherein the wall structure includes at least two concavities.

23. The light-emitting device structure of claim 17, comprising a plurality of wall structures separated from each other.

24. The light-emitting device structure of claim 17, comprising a plurality of wall structures arranged in a staggered manner.

* * * * *